(12) United States Patent
Zebedee

(10) Patent No.: US 8,421,784 B2
(45) Date of Patent: Apr. 16, 2013

(54) DISPLAY

(75) Inventor: Patrick Zebedee, Oxfordshire (GB)

(73) Assignee: Sharp Kabushiki Kaisha, Osaka (JP)

( * ) Notice: Subject to any disclaimer, the term of this patent is extended or adjusted under 35 U.S.C. 154(b) by 1113 days.

(21) Appl. No.: 12/308,571

(22) PCT Filed: Aug. 8, 2007

(86) PCT No.: PCT/JP2007/065889
§ 371 (c)(1),
(2), (4) Date: Dec. 18, 2008

(87) PCT Pub. No.: WO2008/018622
PCT Pub. Date: Feb. 14, 2008

(65) Prior Publication Data
US 2010/0238146 A1    Sep. 23, 2010

(30) Foreign Application Priority Data

Aug. 11, 2006   (GB) .................................. 0615944.6

(51) Int. Cl.
*G09G 5/00* (2006.01)
(52) U.S. Cl.
USPC .............. 345/205; 345/96; 345/204; 341/150
(58) Field of Classification Search ..................... 345/96, 345/204, 205; 341/150
See application file for complete search history.

(56) References Cited

U.S. PATENT DOCUMENTS

| | | |
|---|---|---|
| 4,853,698 A | 8/1989 | Roessler |
| 6,154,121 A | 11/2000 | Cairns et al. |
| 6,970,121 B1 | 11/2005 | Sun |
| 2002/0126033 A1 | 9/2002 | Semmler et al. |
| 2002/0186157 A1 | 12/2002 | Tanaka |
| 2003/0206038 A1 | 11/2003 | Mueck et al. |
| 2005/0200587 A1* | 9/2005 | Hwang .......................... 345/96 |

FOREIGN PATENT DOCUMENTS

| | | |
|---|---|---|
| DE | 35 33 867 | 3/1987 |
| EP | 0 930 716 | 7/1999 |
| EP | 1 184 835 | 3/2002 |
| GB | 2 096 848 | 10/1982 |

(Continued)

OTHER PUBLICATIONS

European Search Report for corresponding European Patent Application No. 07792529.5 dated Sep. 1, 2010.

*Primary Examiner* — Amare Mengistu
*Assistant Examiner* — Premal Patel
(74) *Attorney, Agent, or Firm* — Harness, Dickey & Pierce

(57) ABSTRACT

In one embodiment of the present invention, a display for receiving m-bit display data includes a display driver including a switched capacitor digital/analogue converter including an n-bit input, where m is not greater than n. The upper plates of the capacitors of the switched capacitor digital/analogue converter may be connected, in the zeroing phase, to one of a plurality of reference voltages. The choice of which reference voltage is connected to the upper plates of the capacitors of the switched capacitor digital/analogue converter in the zeroing phase is independent of the input n-bit digital code, and is determined by a signal internal to the display. The output voltage range from the converter in a decoding phase may be a first range in which output voltages are above and below one reference voltage or it may be a second range in which output voltages are above and below another reference voltage, depending on which reference voltage was selected in the preceding zeroing phase.

21 Claims, 9 Drawing Sheets

FOREIGN PATENT DOCUMENTS

| | | |
|---|---|---|
| GB | 2 217 128 | 10/1989 |
| GB | 2 409 777 | 7/2005 |
| GB | 2 414 848 | 12/2005 |
| GB | 2 422 258 | 7/2006 |
| GB | 2422258 A * | 7/2006 |
| JP | 57-073525 | 5/1982 |
| JP | 04-152715 | 5/1992 |
| WO | WO 01/10030 | 2/2001 |

* cited by examiner

CONVENTIONAL TECHNOLOGY

CONVENTIONAL TECHNOLOGY

CONVENTIONAL TECHNOLOGY

CONVENTIONAL TECHNOLOGY

DISPLAY

TECHNICAL FIELD

The present invention relates to a display, in particular to a display having a digital/analogue converter as a display driver. In particular, the digital/analogue converter may be a digital/analogue converter capable of directly driving a load capacitance without the need to provide a buffer amplifier between the converter and the load. Such a converter is known as a "bufferless" converter. Such a converter may be used, for example, for driving matrix columns of a liquid crystal display. A particular application of such a converter is in small display panels for portable applications where it is particularly desirable to minimise power consumption.

BACKGROUND ART

In a liquid crystal display (LCD), a layer of liquid crystal material is sandwiched between two electrodes (both of which, in the case of a transmissive liquid crystal display, are transparent). In operation first and second voltages are applied respectively to the electrodes, and the state of the liquid crystal material is dictated by the absolute value of the difference between the first voltage and the second voltage. The state of the liquid crystal material controls how much light is passed through the liquid crystal display, and thus the brightness.

A liquid crystal display generally comprises a polarity of independently addressable picture elements or "pixels". In an active matrix LCD, one electrode is usually common to all pixels (the "common electrode" or "counter electrode"), while the other electrode is patterned to define a polarity of independently addressable electrodes, each of which corresponds to a pixel (the "pixel electrodes"). A simplified diagram of a pixel is shown in FIG. 1. VCOM represents the voltage applied to the counter electrode 1 of the pixel, while the source line SL, gate line GL and pixel transistor 3 control the voltage applied to the pixel electrode 2 of the pixel. In brief, suitable drive voltages are applied to the source line SL by a display driver DD and to the gate line GL by a suitable drive circuit (not shown in FIG. 1). A suitable voltage to switch the pixel transistor ON is applied to the gate line GL, which is connected to the gate of the pixel transistor. While the pixel transistor 3 is switched ON the pixel electrode is connected to the source line SL and the pixel may be addressed by applying a suitable voltage to the source line.

To prevent long-term degradation of the liquid crystal material in a display, the liquid crystal material must be driven to alternating positive and negative voltages each time it is refreshed (which occurs generally 50-60 times per second), such that the time-averaged dc voltage across the liquid crystal material is zero.

Consider a normally white LCD, where
The "white voltage" (the voltage that must be applied across the liquid crystal material to give 100% transmission of light), $V_W=1V$
The "black voltage" (the voltage that must be applied across the liquid crystal material to give 0% transmission of light), $V_B=3V$ In this example, it is possible to achieve an alternating voltage across the liquid crystal material in one of two ways:
The counter electrode voltage VCOM can be fixed, and the voltage $V_{PIXEL}$ applied to the pixel electrode can be driven alternately to values above and below the fixed value (see FIG. 2(a)). For example, if the counter electrode voltage VCOM is fixed at 2V, the pixel voltage may be alternately in the range 3 to 5V and the range 1 to −1V.
The range for the pixel voltage can be chosen to cover the range of required LC voltages ($V_B-V_W=2V$), and counter electrode voltage VCOM can alternate to give the correct dc level to the liquid crystal (see FIG. 2(b)). For example, the pixel voltage $V_{PIXEL}$ may always be in the range 0 to 2V, and the counter electrode voltage VCOM may alternate between −1V and 3V.

It can be seen that use of an alternating counter electrode voltage VCOM reduces the range of voltages required to be supplied to the pixel electrode 2, and therefore simplifies the design of the digital/analogue converters (DACs) which generate these voltages. In typical systems, the counter electrode voltage VCOM alternates every row time (approximately every 50 μs).

However, use of an alternating counter electrode voltage VCOM also has disadvantages:
The counter electrode 1 presents a large capacitance, which therefore takes time to charge. During this time, data cannot be written to the pixels, so the time between rows (blanking time) is increased.
The counter electrode 1 is a large area of conductor, which is therefore susceptible to electro-static discharge (ESD). The usual solution to ESD is to provide a low-resistance path to ground via a protection diode at the point where connection is made to the glass of the display, but such circuits usually contain resistors and so are generally omitted for the counter electrode (so that it charges as quickly as possible). As a result, the counter electrode provides a conduction path into the VCOM driver circuit, which may be damaged by ESD.
Since the load on counter electrode voltage VCOM is large, it is often driven by a very large op-amp buffer, which consumes a large quiescent current. However, since the counter electrode voltage VCOM is switched infrequently, only a small proportion of this current is used to drive the load, with the remainder flowing to ground through the buffer, consuming unnecessary power.

In general, it is preferable to minimise the number of voltage references required in a system. Each reference must be accurately generated, and then buffered (if it will supply current).

To reduce system complexity, it would be preferable for:
the DACs that supply the pixel voltage to use as the reference voltages the same voltages as provided by the supply rails for, for example, logic circuits and clock circuits in the DAC (or other circuits in the system);
the counter electrode voltage VCOM to be fixed, ideally to ground (to overcome the problem ESD);
or (if VCOM cannot be fixed) the difference between the high and low values of counter electrode voltage VCOM to be the same as the voltage of one supply rail. For example, in a system with supply rails of 0V, 3V and 5V, the difference between the high and low values of VCOM would ideally be 3V or 5V. In this case, the counter electrode voltage VCOM could be driven by an inverter, which consumes less quiescent current than an op-amp buffer.

Note that it is possible to generate an adjustable dc offset for VCOM more easily, since this reference is not required to supply current.

FIG. 3 of the accompanying drawings illustrates a known type of switched capacitor digital/analogue converter (DAC) for converting an n-bit digital word (or n-bit digital "code") to a corresponding analogue output. The DAC comprises n-capacitors $C_1, \ldots, C_n$. The DAC further comprises a terminating capacitor $C_{TERM}$ connected between the input of a unity gain buffer 4 and ground. The first electrodes of the capacitors $C_1, \ldots, C_n$ are connected together and to the first terminal of the terminating capacitor $C_{TERM}$. The second terminal of each of the capacitors $C_1, \ldots, C_n$ is connected to a respective switch, such as 5, which selectively connects the second electrode to a first or second reference voltage input $V_1$ or $V_2$ in accordance with the state or value of a corresponding bit of the digital word. The output of the buffer 4 drives a capacitive load $C_{LOAD}$, for example in the form of a data line or column electrode of an active matrix of a liquid crystal device.

The DAC has two phases of operation, namely a resetting or "zeroing" phase and a converting or "decoding" phase, controlled by timing signals which are not illustrated in FIG. 3. During the zeroing phase, the first and second electrodes of the capacitors $C_1, \ldots, C_n$ and the first electrode of the terminating capacitor $C_{TERM}$ are connected together by an electronic switch 6 and to the first reference voltage input $V_1$. The capacitors $C_1, \ldots, C_n$ are therefore discharged so that the total charge stored in the DAC is equal to $V_1 C_{TERM}$.

During the decoding phase, the second electrode of each capacitor $C_i$ is connected to the first reference voltage input $V_1$ or to the second reference voltage input $V_2$ according to the value of the ith bit of the digital input word. The charge stored in the DAC is given by:

$$Q = \sum_i b_i C_i (V_{DAC} - V_2) + \sum_i (1 - b_i) C_i (V_{DAC} - V_1) + V_{DAC} C_{TERM} \quad (1)$$

where $b_i$ is the ith bit of the input digital word and $V_{DAC}$ is the voltage at the first electrodes of the capacitors $C_1, \ldots, C_n$ and $C_{TERM}$. The output voltage is therefore given by:

$$V_{DAC} = V_{OUT} = \frac{\sum_i b_i C_i}{\sum_i C_i + C_{TERM}} (V_2 - V_1) + V_1 \quad (2)$$

In general, $C_i = 2^{(i-1)} C_1$ and $C_1 = C_{TERM}$. This results in a set of output voltages which are linearly related to the input digital word.

In order to isolate the load capacitance from the DAC and to prevent it from affecting the conversion process, the unity gain buffer 4 is provided. However, such buffers are a substantial source of power consumption, and it is therefore desirable to omit the buffer 4 in a low power system. In this case, the load capacitance replaces $C_{TERM}$, as shown in FIG. 4.

UK patent application No. 0500537.6 discloses a DAC suitable for use without a buffer amplifier. This DAC is shown in FIG. 5.

The components of an n-bit DAC of UK patent application No. 0500537.6 are an (n−1)-bit switched capacitor DAC of the type described in FIG. 3 and three reference voltage sources, $V_1, V_2, V_3$. One of the reference voltage sources ($V_1$) is connected to the top plate of the capacitor array during the zeroing phase as switch 7 is closed by a timing signal $F_1$. The other reference voltage sources ($V_2, V_3$) are connected to the bottom plates of the capacitors $C_i$ according to the input data and timing signals $F_1, F_2$, by means of respective switches 8.

In the preferred embodiment, the voltages on the bottom plates are configured so that the capacitors can inject charge onto the DAC output in either a positive or negative sense. In this way, the output of the DAC covers a range of voltages symmetrically above and below the first reference voltage, as shown in FIG. 6. The output voltage is given by $$V_{DAC} = V_1 + \frac{\sum_{i=1}^{n-1} b_i C_i}{\sum_{i=1}^{n-1} C_i + C_{TERM}} (V_3 - V_2) \quad (3)$$

$$= V_1 - \frac{\sum_{i=1}^{n-1} (1 - b_i) C_i}{\sum_{i=1}^{n-1} C_i + C_{TERM}} (V_3 - V_2)$$

when the most significant bit, $b_n$, is 1 or 0 respectively. FIG. 6 illustrates this output.

The dc level of the output voltage is set by $V_1$, while the output range of the DAC is set by the relative size of the switched capacitors and the terminating capacitor (or load, if the DAC is used without a buffer), and the difference between $V_3$ and $V_2$.

In the case of where a pixel of a liquid crystal display is driven with a fixed counter electrode voltage VCOM a wide range of pixel voltages are required, which must be generated by the DAC used to drive the source line SL of FIG. 1. This necessitates either large capacitors (especially if the DAC is used without a buffer, since the DAC capacitors must be large relative to the load—which is itself large), or a high value of $(V_3-V_2)$. Neither of these is desirable: large capacitors increase the area required for the DAC, whereas a high value of $(V_3-V_2)$ may make the voltages more difficult to generate.

It would therefore be advantageous to reduce the output range required for the DAC, so allowing relatively small capacitors and relatively low voltages to be used.

FIG. 7 shows a further prior art DAC. This is a "segmented" DAC, of the type disclosed in U.S. Pat. No. 6,154,121. The segmented DAC of FIG. 7 receives a k-bit data input, of which the m most significant bits of the data select the reference voltages to be used by a DAC 11 controlled by the n least significant bits of the input data. For example, the most significant bits of the input data will determine whether the DAC output corresponding to the least significant bits is in the range $V_1$ to $V_2$, $V_2$ to $V_3$, $V_3$ to $V_4$ etc. The resulting output is therefore made up of segments, each of which is continuous with its neighbours.

In the segmented DAC of FIG. 7, the k-bit input data is input to a store 9, and the m most significant bits are passed to a $2^m$ decoder 10a and a reference selector 10b of a first DAC stage 10. The reference selector 10b selects two (or more) voltages from a plurality of reference voltages and provides the selected voltages to the DAC of a second DAC stage 11; these voltages constitute, for example the DAC reference voltages $V_1, V_2$ of FIG. 3. The voltages selected by the reference selector 10b are determined by the output from the decoder 10a which, in turn, is determined by the m most significant bits of the input data. That is, the reference voltages supplied to the DAC are controlled by the input data.

Bipolar DACs are required to generate positive and negative output voltages in response to signed digital data (in signed digital data, the most significant bit of the input data represent the sign (positive or negative) of the input data. One method of doing this is described in U.S. Pat. No. 4,853,698, from which FIG. 8 is taken. In the circuit of FIG. 8, the voltage connected to the lower plates of the capacitors is chosen to be either positive or negative, $\pm V_{ref}$, in dependence on the most significant bit of the input data. The most significant bit of the input data controls a switching arrangement 12 to select either $+V_{ref}$ or $-V_{ref}$ depending on the most significant bit of the input data. The two segments of the output extend from $-V_{ref}$ to ground, and from ground to $V_{ref}$.

In this type of DAC the sign of the reference voltage is determined by the input data.

UK patent publication No. 2414848 describes a system whereby image data is sent to a multiple view directional display with an additional bit. The additional bit indicates whether the image is intended to be visible from the left or right side of the display. Within the display, the additional bit selects a different range of voltages for the DAC, with the voltage range dictating the angle at which the image will be visible. In the DAC of FIG. 9, which is taken from UK patent publication No. 2 414 848, the additional bit OIF selects the DAC reference voltages to be either $V_1$ and $V_2$ or $V_3$ and $V_4$ by means of switches 13-16 and an inverter 17.

In the system of UK patent publication No. 2414848, the connection of the reference voltages is again controlled by the data sent to the display by the host. Moreover, the additional bit OIF selects the DAC reference voltages to be either $V_1$ and $V_2$, or $V_3$ and $V_4$, for every capacitor.

US 2002/0186157 discloses a digital to analogue converter for converting an n-bit digital word. In order to reduce the area of the DAC, it has only m (where m<n) switched capacitors, which receive the m least significant bits of the input n-bit data word.

The remaining (n−m) bits of an input data word are input to a resistive divider circuit, which is connected between first and second reference voltages. The resistive divider circuit generate a voltage whose level depends on the values of the n−m most significant bits of the input data word. In the reset phase, the voltage produced by the resistive divider circuit is supplied to the output terminal of each of the switched competitors of the DAC.

DISCLOSURE OF INVENTION

The present invention provides a display for receiving display data from a host as an input m-bit digital code, where m is an integer greater than one, the display having a display driver for converting the input m-bit digital code and including a digital/analogue converter; wherein the digital/analogue converter comprises a switched capacitor digital/analogue converter having an output and an n-bit digital input; and a switching arrangement; wherein the switching arrangement is adapted, in a zeroing phase of operation, to connect one of a plurality of reference voltages to the first plate of at least one capacitor of the switched capacitor digital/analogue converter; wherein the n-bit input to the digital/analogue converter is, or is derived from, the m-bit digital code; and wherein an input to the switching arrangement is an internal signal and is independent of the input n-bit digital code.

According to the present invention, the one of the plurality of reference voltages that is selected for connection to the first plate of the capacitor(s) of the switched capacitor digital/analogue converter is selected independently of the input digital code to the DAC, on the basis of an internal signal. In contrast, in the prior art DACs described above, the selection of the reference voltage is determined by the input data code.

The input to the switching arrangement may be time-dependent, so that the reference voltage that is selected for connection to the first plate of the capacitor(s) of the switched capacitor digital/analogue converter varies with time. Alternatively, the input to the switching arrangement may be constant over time.

The output voltage range from the converter in a decoding phase may be a first range in which output voltages are above and below one reference voltage or it may be a second range in which output voltages are above and below another reference voltage, depending on which reference voltage was selected in the preceding zeroing phase. This means that for a given input digital code, a DAC of the present invention may output one of two or more different output voltages, depending on which of the reference voltages was selected by the switching arrangement in the preceding zeroing phase.

Where a DAC of the present invention is used to drive a system, the input to a switching arrangement may be a "state signal" that is internal to the operation of the system and is not perceptible to a user. For example, where a DAC of the present invention is being used to drive a liquid crystal display device, the input digital code corresponds to the desired grey level of the display (or of a pixel of the display). The state signal may correspond to an internal state of the display device, for example such as whether the liquid crystal should be driven with a positive voltage or with a negative voltage in the current row time. In general, the state signal may be any signal that varies in time and that represents a state of the system that is being driven by the converter.

The switched capacitor digital/analogue converter may be a bi-directional switched capacitor digital/analogue converter. By a "bi-directional switched capacitor digital/analogue converter" is meant a switched capacitor DAC having a voltage output of the form given by equation (3) and shown in FIG. 6, in which the output covers a range of voltages above and below the reference voltage $V_1$. As an example, a bi-directional switched capacitor digital/analogue converter may have the general form shown in FIG. 5 of the present application.

The switching arrangement may be adapted to, in a decoding phase, isolate the first plate of each capacitor of the switched capacitor digital/analogue converter from the plurality of reference voltages.

The switching arrangement may be adapted, in the zeroing phase of operation, to connect the first plate of the at least one capacitor to one of a first reference voltage and a second reference voltage. That is, the switching arrangement selects one of two reference voltages for connection to the first plate.

The first and second reference voltages may be selected such that the output voltage range from the converter in a decoding phase when the first reference voltage was selected in the immediately preceding zeroing phase does not overlap the output voltage range from the converter in a decoding phase when the second reference voltage was selected in the immediately preceding zeroing phase. This embodiment may be considered as providing a converter with an output voltage range that can be driven about two different DC levels. Such a converter may be used, for example, for driving a liquid crystal display device according to a drive scheme in which the counter electrode voltage VCOM is maintained at a fixed value. The values of the first and reference voltages are selected such that, when one of them is selected in the zeroing phase, the converter output voltage range in the subsequent decoding phase is suitable for driving the liquid crystal material to be positive, and such that, when the second reference voltage is selected in the zeroing phase, the converter output voltage range in the subsequent decoding phase is suitable for driving the liquid crystal material to be negative. A driving method of FIG. 2(*a*) may therefore be implemented without the need to provide a converter having a wide output range, or without the requirement to generate and switch several different voltages.

Alternatively, the first and second reference voltages may be selected such that the output voltage range from the converter in a decoding phase when the first reference voltage was selected in the immediately preceding zeroing phase overlaps the output voltage range from the converter in a decoding phase when the second reference voltage was selected in the immediately preceding zeroing phase. This embodiment may for example be used in a converter for driving a liquid crystal display device according to a drive scheme in which the counter electrode voltage VCOM alternates from one row time to another as shown in FIG. 2(b). The invention allows the swing of the counter electrode voltage VCOM to be reduced, while not requiring a DAC with a large output voltage range.

Moreover, the first and second reference voltages may be chosen such that the counter electrode voltage VCOM is easier to drive. The counter electrode voltage VCOM is easier to drive if the difference between its low value VCOM(low) and its high value VCOM(high) is equal to the voltage supplied by a voltage supply rail in the system. For example, if there exists in the system a 3.3V supply rail and VCOM is driven between 0.7V and 4V, VCOM may be driven using a digital inverter driven by a clock signal and whose output is capacitively connected to a node between two resistors. The resistors set the dc level of the output voltage, and the 3.3V voltage swing of the inverter sets the swing. The inverter is required only to provide additional output drive, and the inverter output is still a clock signal.

The converter may be a buffer-less converter, and the output may be for direct connection to a capacitive load.

The switched capacitor digital/analogue converter may comprise (n−1) capacitors.

The display may comprise: an image display layer; and the driver may be for driving at least a selected region of the image display layer. For example, the display driver may be used to drive one or more source lines SL of a pixelated active matrix display having the general arrangement show in FIG. 1.

The input to the switching arrangement may be dependent on a state of the image display layer.

The input to the switching arrangement may be time-dependent.

The image display layer may be a layer of liquid crystal material.

The input to the switching arrangement may be dependent on the polarity of the liquid crystal material.

In one embodiment, m=n. In this case the m-bit digital data input to the display may be passed to the input of the digital/analogue converter.

In an alternative embodiment m<n. This may allow, for example, for gamma correction of the input data.

The display driver may comprise means for deriving the n-bit input to the digital/analogue converter from the input m-bit digital code.

Additional objects, features, and strengths of the present invention will be made clear by the description below. Further, the advantages of the present invention will be evident from the following explanation in reference to the drawings.

BRIEF DESCRIPTION OF DRAWINGS

Preferred embodiments of the present invention will now be described by way of illustrative example, with reference to the accompanying figures in which.

BEST MODE FOR CARRYING OUT INVENTION

The present invention will be described, by way of illustrative example, with reference to a bi-directional switched capacitor DAC having the general structure shown in FIG. 5 of the present application. The invention is not, however, limited to a DAC of this particular form.

Figure 1:
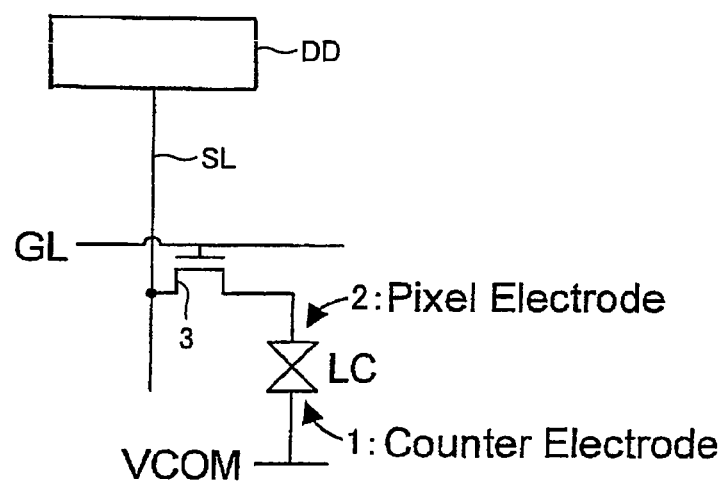
FIG. 1 is a schematic illustration of a pixel of a liquid crystal display.
Figure 10A:
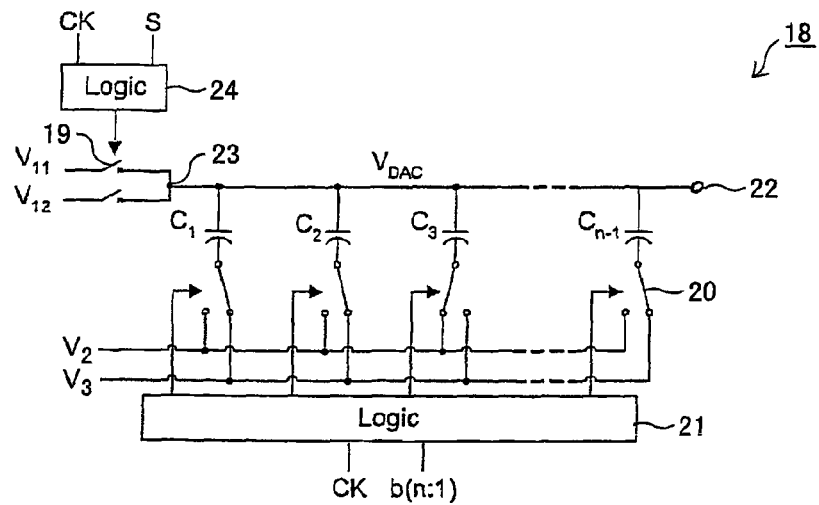
FIG. 10(a) is a block circuit diagram of a DAC suitable for use in a display according to an embodiment of the present invention.

FIG. 10(a) is a block circuit diagram of a digital/analogue converter 18 suitable for use as a display driver in a display according to a first embodiment of the present invention. The DAC 18 of FIG. 10(a) is for converting an input n-bit digital code (where n is greater than 1) into an output voltage. FIG. 10(a) shows the invention applied to a "buffer-less" DAC, having an output 22 suitable for direct connection to a load capacitance (not shown). By the term "buffer-less DAC" as used herein is meant a DAC in which the unity gain output buffer 1 of FIG. 1 is not required to be present.

When the DAC of FIG. 10(a) is incorporated in a display driver for driving a display device the load capacitance may, for example, comprise a source line of an active matrix liquid crystal display device.

Figure 3:
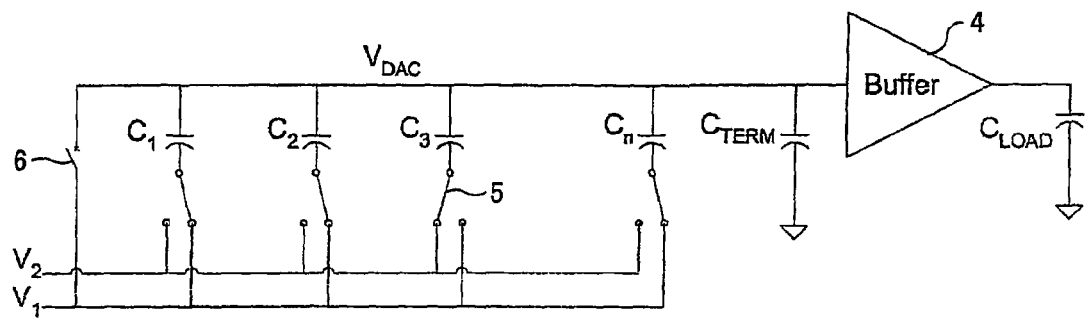
FIG. 3 shows a typical switched capacitor DAC.
Figure 4:
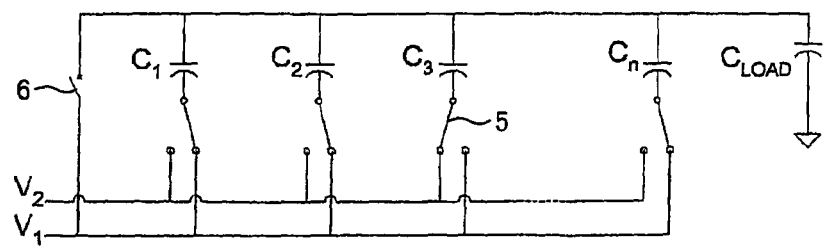
FIG. 4 shows a buffer-less switched capacitor DAC in which the output is connected directly to a load.

The n-bit DAC of FIG. 10(a) comprises a plurality of capacitors. In the embodiment of FIG. 10(a) the DAC is a bi-directional switched capacitor DAC of the general type shown in FIG. 5, and therefore comprises (n−1) capacitors $C_1, C_2 \ldots C_{n-1}$. The invention is not however limited to this particular form of DAC, and any particular DAC may be used. For example, a DAC of the general form shown in FIG. 3 or 4 may be used and, in that case, the n-bit DAC would comprise n capacitors.

The bottom plate of each capacitor is connected to a respective switch 20 controlled by a respective output of a logic circuit 21. (In the description, the term "upper plate" will be used to denote the plate of a capacitor $C_i$ that is connected to the output 22 of the converter, and the other plate of a capacitor $C_i$ will be referred to as the "lower plate". This wording is used purely for convenience and does not limit the DAC to any specific orientation in use.) The upper plate of each capacitor $C_i$ of the DAC is connected to a first reference voltage input 23. The first reference voltage input 23 may be connected to either a first reference voltage source $V_{11}$ or to a second reference voltage source $V_{12}$ (where $V_{11}{}^I V_{12}$) by means of a switching arrangement 19 controlled by a further logic circuit 24.

The lower plate of each capacitor $C_i$ of the DAC is connectable, by a respective one of the switches 20, to either a third reference voltage source $V_2$ or a fourth reference voltage source $V_3$. The third reference voltage $V_2$ is different from the fourth reference voltage $V_3$.

The DAC of FIG. 10(*a*) operates in a zeroing phase followed by a decoding phase. In the zeroing phase, the switching arrangement 19 connects the first reference voltage input 23 to either the first reference voltage source $V_{11}$ or to the second reference voltage source $V_{12}$. The upper plate of each capacitor $C_i$ of the DAC is thus held at the potential of either the first reference voltage $V_{11}$ or of the second voltage $V_{12}$. The output voltage of the DAC is thus charged to either the first reference voltage $V_{11}$ or to the second reference voltage $V_{12}$ as appropriate.

In the decoding phase the switching arrangement 19 is controlled to isolate the first reference voltage input 23 from both the first reference voltage source $V_{11}$ and the second reference voltage source $V_{12}$. The output voltage of the DAC floats to a voltage that is dependent upon the input code.

In a preferred embodiment, as described in co-pending patent application No. 0500537.6 (the contents of which are incorporated herein by reference), the connection of the lower plate of each capacitor $C_i$ of the DAC during the zeroing phase and the decoding phase is dependent upon the respective bit $b_i$ of the input data code, and on the most significant bit, $b_n$, of the input data code. There are essentially two possibilities for the connection of the lower plate of each capacitor $C_i$—either (a) the voltage applied to the lower plate of the capacitor $C_i$ during the decoding phase may be different from the voltage that was applied to the lower plate of the capacitor $C_i$ during the zeroing phase, so that charge is injected across the $i^{th}$ capacitor $C_i$ in the decoding phase or (b) the voltage applied to the lower plate of the capacitor $C_i$ during the decoding phase may be the same as the voltage that was applied to the lower plate of the capacitor $C_i$ during the zeroing phase, so that no charge is injected across the $i^{th}$ capacitor $C_i$ in the decoding phase. If charge is injected across the $i^{th}$ capacitor $C_i$ during the decoding phase, the sign of the injected charge is determined by the most significant bit $b_n$ of the input data code.

Figure 6:
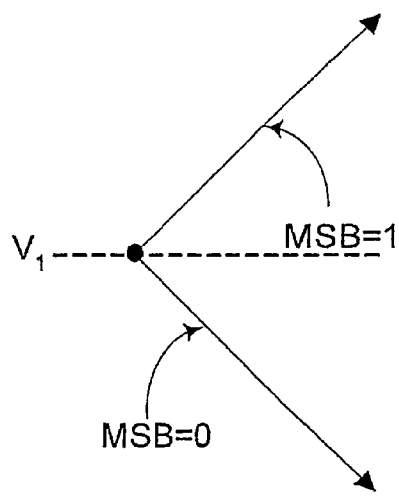
FIG. 6 shows the output voltage from the DAC of FIG. 5.
Figure 7:
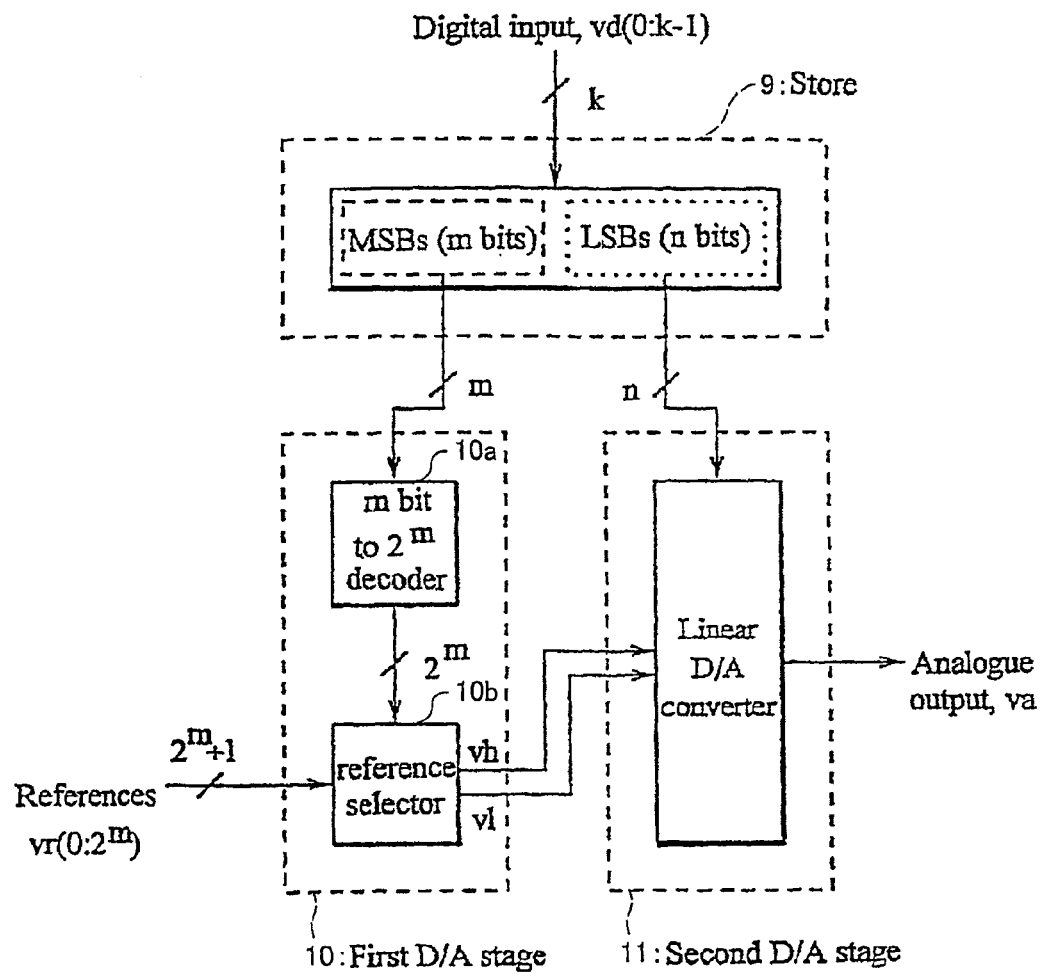
FIG. 7 is a block circuit diagram of a segmented DAC.
Figure 8:
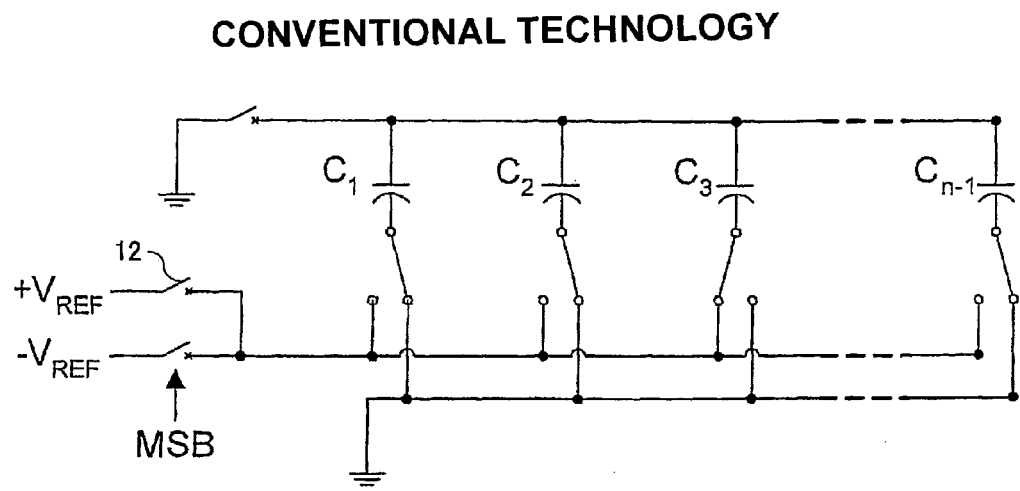
FIG. 8 shows a bipolar switched capacitor DAC suitable for use with signed digital data.
Figure 9:
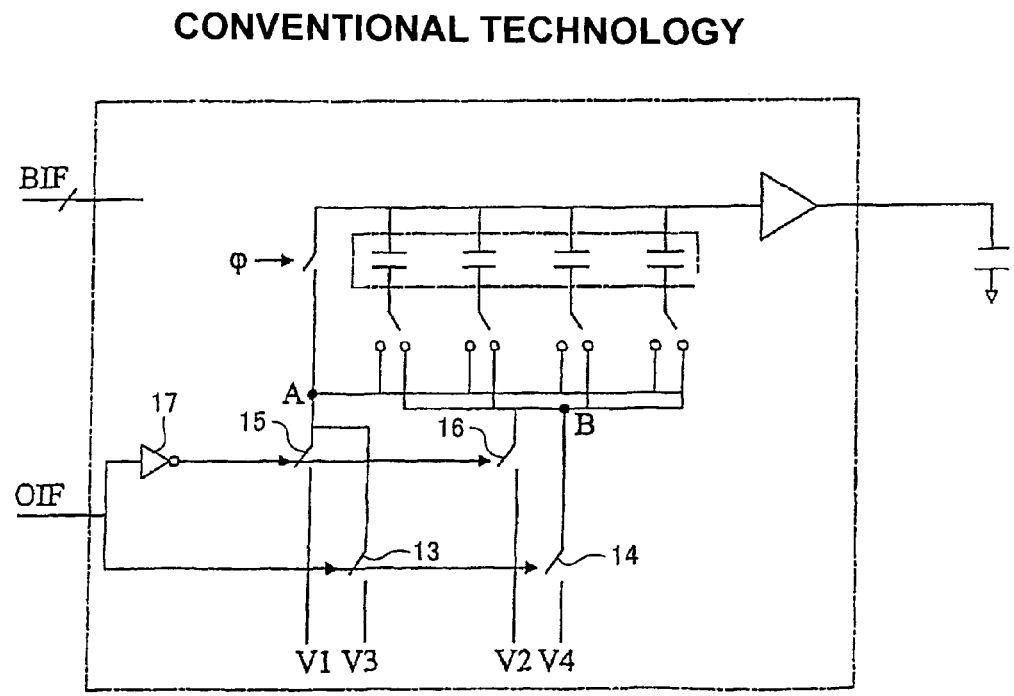
FIG. 9 is a block circuit diagram of a DAC in which reference voltages are selected by an additional bit added to an input data code.

The output voltage from the DAC will thus have the general form shown in FIG. 6 and defined by equation (3) above but with $V_1$ replaced by either $V_1$ or $V_{12}$, depending on which of the reference voltages $V_{11}$ or $V_{12}$ is selected by the switching arrangement 19. (In an embodiment in which no terminating capacitor is provided, as in FIG. 10(*a*), the quantity $C_{TERM}$ in the denominator of equation (3) will be replaced by $C_{LOAD}$, where $C_{LOAD}$ is the load capacitance being driven by the converter.) The general form of the output voltage of the DAC of FIG. 10(*a*) is shown in FIG. 10(*b*). As can be seen, the output voltage range may be a first range 25 in which output voltages are above and below the first reference voltage $V_{11}$ or it may be a second range 26 in which output voltages are above and below the second reference voltage $V_{12}$ (the two output ranges are laterally displaced in FIG. 10(*b*) for clarity).

The logic circuit 21 of FIG. 10(*a*) may be any suitable logic circuit that controls the switches 20 to control injection of a charge across the $i^{th}$ capacitor $C_i$ in the decoding phase in dependence on the input data code, for example in the manner described above and described in more detail in UK patent application No. 0500537.6. In particular, the logic circuit 21 may control the switches 20 in any of the ways described in the UK patent application No. 0500537.6. If desired, each switch 20 may alternatively be controlled by a separate discrete logic circuit, in the manner shown in FIG. 5 of the present application.

The switching arrangement 19 that determines which of the first or second reference voltages is connected to the first reference voltage input 23 in a zeroing phase is controlled by the further logic circuit 24. According to the invention, the input to the switching arrangement 19 is a signal that is internal to the display—for example that is generated within the display and/or that is dependent on a state of the display. In FIG. 10(*a*) one input to the further logic circuit 24 is a timing signal CK, for example a clock signal that indicates whether the DAC is in a zeroing phase (so that the switching arrangement must connect one of the first and second reference voltages to the first reference voltage input) or is in a decoding phase (so that the switching arrangement should isolate the first reference voltage input from both the first and second reference voltages). The other input to the logic circuit 24 of FIG. 10(*a*) is a state signal S that, for example, is some way indicative of the state of a system, for example an image display layer, that is being driven by the DAC. The state signal is not dependent on the input data code to the DAC and, thus, the operation of the switching arrangement 19 is independent of the n-bit data code input to the DAC. The state signal may be time-dependent, or it may be constant over time.

Where the DAC is being used to drive a liquid crystal display, for example when the DAC is used as a source driver circuit to drive the source line SL of a pixel having the general form shown in FIG. 1, the state signal S may represent a characteristic of the liquid crystal material of the display. For example, the state signal may indicate the polarity of the liquid crystal (by "polarity" is meant whether the liquid crystal material is required to be driven with a positive voltage or a negative voltage in the current row time).

In FIG. 10(*b*), the range of output voltages 25 obtained when the first reference voltage $V_{11}$ is selected in the preceding zeroing phase does not overlap with the range of output voltages 26 obtained when the second reference voltage $V_{12}$ is selected in the preceding zeroing phase. This may be achieved by appropriate selection of the first to fourth reference voltages $V_{11}$, $V_{12}$, $V_2$, $V_3$.

A DAC for a display of the present invention in which the two ranges 25, 26 of output voltage do not overlap with one another may be used, as an example, to drive a liquid crystal display device using a drive scheme similar to that shown in FIG. 2(*a*) which uses a DC counter electrode voltage VCOM. A DC counter electrode voltage VCOM is superimposed on FIG. 10(*b*), and it can be seen that the output voltage range 25 based around $V_{11}$ is suitable for providing a pixel voltage when the liquid crystal is driven with a positive voltage (as in the left hand part of FIG. 2(*a*)), and that the voltage range 26 based around $V_{12}$ is suitable for supplying the pixel voltage when the liquid crystal material is driven with a negative voltage (as in the right hand part of FIG. 2(*a*)). In this embodiment, therefore the state signal S input to the logic circuit 24 would take one value when it was desired to drive the liquid crystal material with a positive voltage, and would take a different value when it was desired to drive the liquid crystal material with a negative voltage (so that the state signal would be a time-dependent state signal). The first value of the state signal S would lead to the first reference voltage $V_{11}$ being connected to the reference voltage input 23 in the zeroing phase, and the second value of the state signal S would lead to the second reference voltage $V_{12}$ being connected to the reference voltage input 23 in the zeroing phase.

Figure 2A:
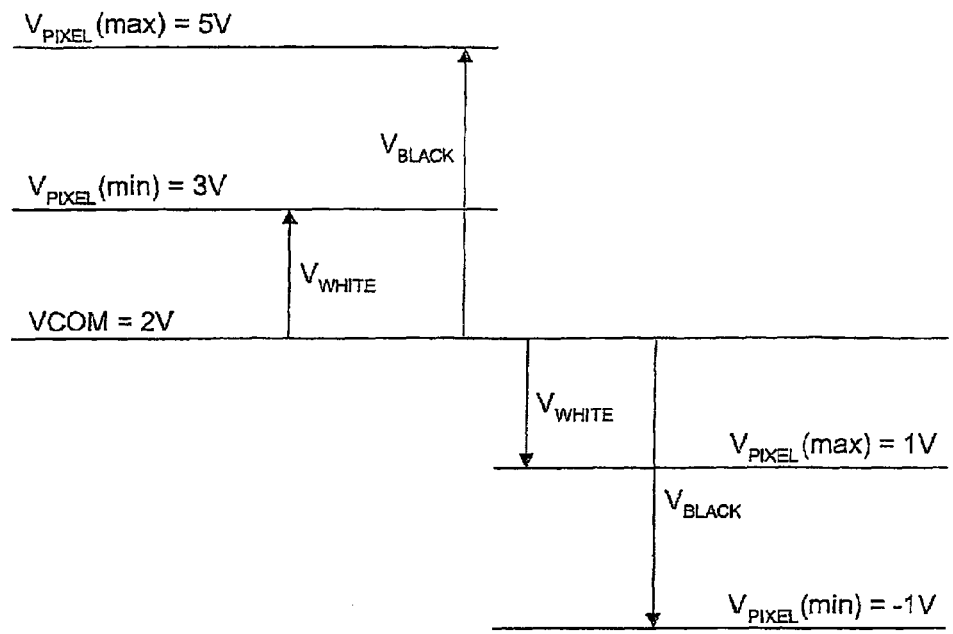
FIG. 2(a) shows pixel voltages and counter electrode voltages for a drive scheme in which a pixel is driven with a DC counter electrode voltage.
Figure 10B:
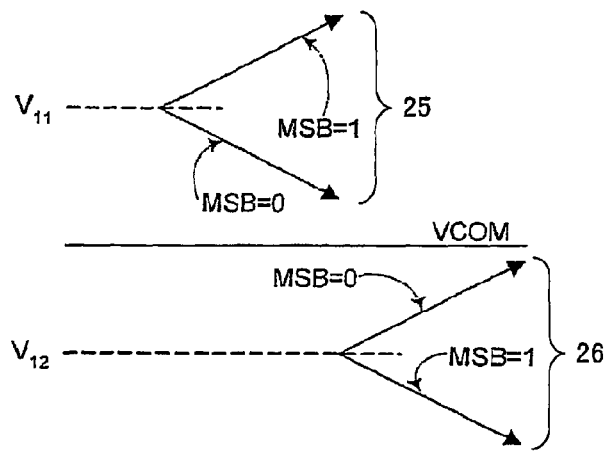
FIGS. 10(b) and 10(c) illustrate output voltages of the DAC of FIG. 10 (a)

Since a DAC for a display of the present invention provides one of two different output voltage ranges 25, 26 based about two different DC levels, the DAC may provide all pixel voltages required for a drive scheme of the form shown in FIG. 2(a) even if each of the output voltage ranges 25,26 is relatively small. In the example of FIG. 10(b), for example, each voltage range 25, 26 will be required to have an extent of slightly greater than 2V, since the difference between $V_{PIXEL}$ (max) and $V_{PIXEL}$ (min) for a liquid crystal material is typically 2V. The present invention thus allows the drive scheme of FIG. 2(a) to be implemented without the need for a DAC that has a wide output voltage range, or without the requirement to generate and switch several different voltages.

Figure 2B:
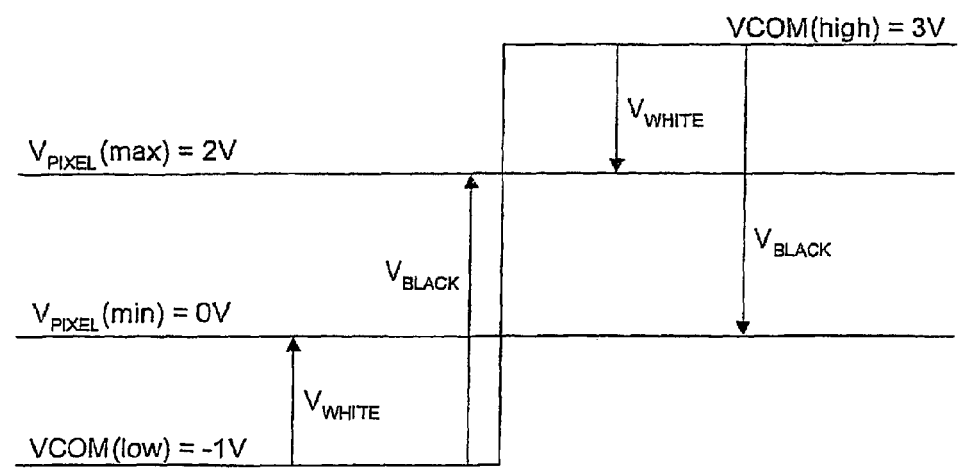
FIG. 2 (b) shows pixel voltages and counter electrode voltages for a drive scheme in which a pixel is driven with an alternating counter electrode voltage.
Figure 10C:
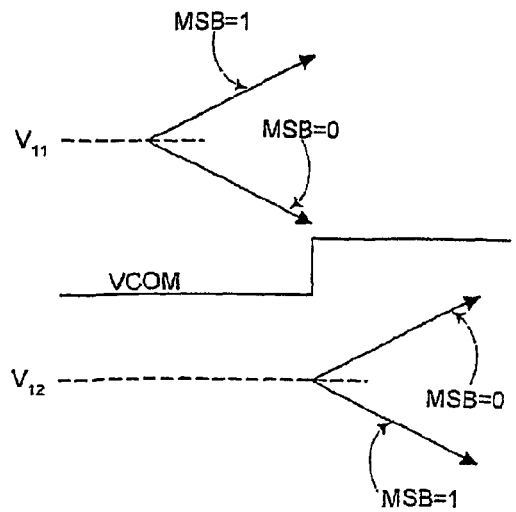

A DAC in which the two output voltage ranges 25 and 26 do not overlap may also be used to drive a liquid crystal display having an alternating counter electrode voltage VCOM according to the drive scheme of FIG. 2(b). This is illustrated in FIG. 10(c), which shows the two voltage output ranges 25,26 of the DAC with an alternating counter electrode voltage VCOM superimposed. In this embodiment, a DAC may be used to reduce the difference between the high value of the counter electrode voltage and the low value of the counter electrode voltage, and/or to make the counter electrode voltage easier to drive by making the difference between the two values of VCOM equal to the voltage supplied by a voltage supply rail in the system.

Figure 11:
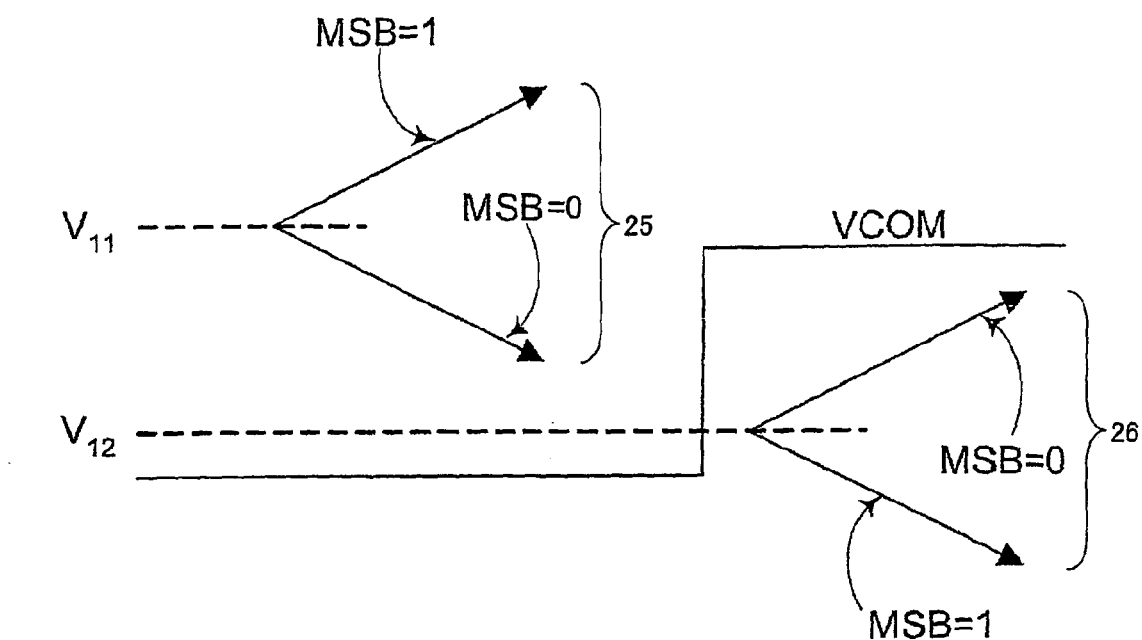
FIG. 11 shows alternative output voltage ranges of a DAC of the present invention.

In an alternate embodiment of the invention, the first to fourth reference voltages $V_{11}, V_{12}, V_2, V_3$ may be chosen such that the first output voltage range 25 of the DAC overlaps the second output voltage range 26, as shown in FIG. 11. This may be done, for example, by reducing the difference between the first and second reference voltages $V_{11}, V_{12}$ so that the DC offset between the centres of the two voltages ranges 25, 26 is reduced. Additionally and alternatively, this may be done by increasing the magnitude of the term $(V_3-V_2)$ so as to increase the extent of each of the output ranges 25, 26 to cause the two output ranges to overlap with one another.

In this embodiment a DAC may be used to drive a liquid crystal display according to a drive scheme having an alternating counter electrode voltage VCOM as shown in FIG. 2(b). This is indicated in FIG. 11 by superimposing an alternating counter electrode voltage VCOM: —it can be seen that the voltage range 25 obtained when the first reference voltage $V_{11}$ is selected in the preceding zeroing phase may be used to supply the pixel voltage $V_{PIXEL}$ when VCOM is low and a positive voltage is required across the liquid crystal material, whereas the output voltage range 26 obtained when the second reference voltage $V_{12}$ is selected in the preceding zeroing phase may be used to supply the pixel voltage $V_{PIXEL}$ when VCOM is high and a negative voltage is required across the liquid crystal layer. In this embodiment, the required swing in the counter electrode voltage VCOM may be reduced, without the need to provide a corresponding increased output voltage range for the DAC. A further advantage is that the first and second reference voltages $V_{11}, V_{12}$ may be selected such that the counter electrode voltage is easier to drive by making the difference between the two values of VCOM equal to the voltage supplied by a voltage supply rail in the system.

In the embodiment of FIG. 10(a), the switching arrangement connects, in the zeroing phase, the first reference voltage input 23 to one of two possible reference voltages. The invention is not, however, limited to this, and the switching arrangement may alternatively select one of three or more different reference voltages for connection to the first reference voltage input 23 in the zeroing phase. In such an embodiment the output of the DAC in a decoding phase would be one of three or more possible voltage ranges, with each possible voltage range based on a different DC level. For example, some liquid crystal display devices have two gate driver circuits, and the gate lines are arranged such that the gate lines on one side of the display are driven by one gate driver circuit and the gate lines on the other side of the display are driven by the other gate driver circuit. In this case, if a single DAC were to drive pixels on both sides of the display, it might be desirable to select one of four possible voltage ranges, each based on a different dc level, for the four possible states given by the choices of left side or right side and liquid crystal polarity positive or negative.

Figure 5:
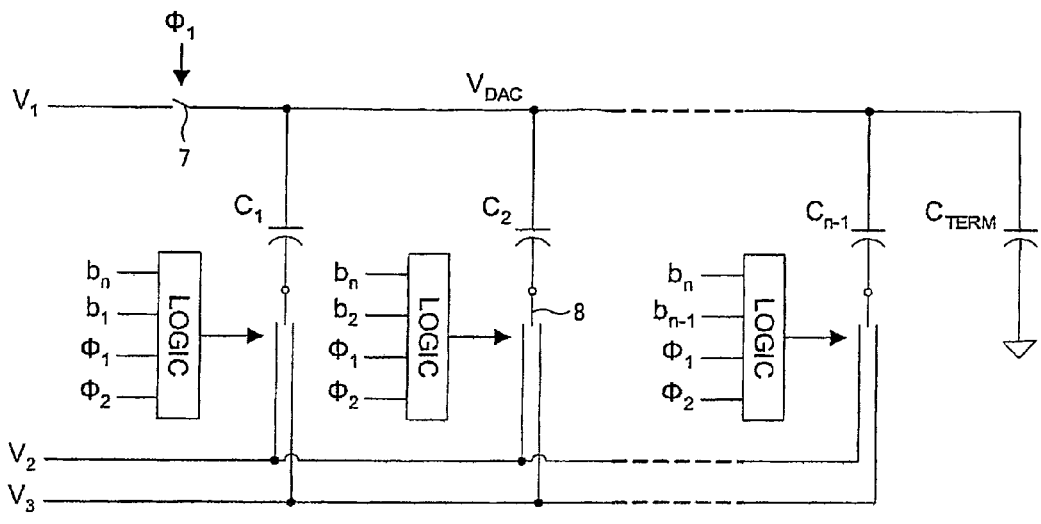
FIG. 5 shows a three reference bi-directional DAC.

The invention has been described above with reference to a bi-directional DAC of the general type show in FIG. 5 of the present application. The invention is not, however, limited to this, and may be applied with other forms of DAC. As an example, the invention may be acquired with a conventional DAC of the type shown in FIG. 3 or 4. To do this, the first reference voltage source $V_1$ shown in FIG. 3 or 4 would be replaced by two (or more) reference voltages $V_{11}, V_{12}$ and a switching arrangement for selecting one of the reference voltages independently from the input data code. This will provide a DAC having an output consisting of two or more branches, with each branch being given by an equation similar to equation (2) above, but with $V_1$ replaced by $V_{11}$ or $V_{12}$ as appropriate.

In the DAC of FIG. 10(a), the capacitors may be arranged such that $C_i=2^{i-1}C_1$, but the invention is not limited to this.

FIG. 10(b) shows the invention applied to a buffer-less DAC. In principle, the invention could be applied to a buffered DAC.

Figure 12:
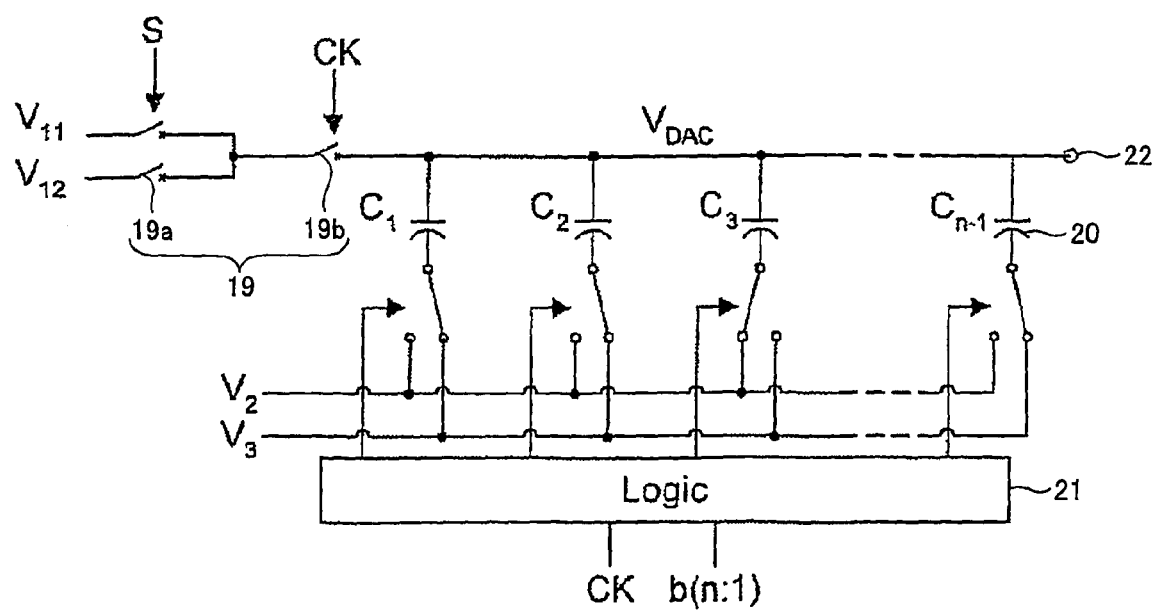
FIG. 12 is a block circuit diagram of a DAC suitable for use in a display according to an embodiment of the present invention.

In the embodiment of FIG. 10(a) the switching arrangement 19 for selecting either the first reference voltage source $V_{11}$ or the second reference voltage source $V_{12}$ to be applied in the zeroing phase comprises a single switch that is controlled by the further logic circuit 24 having as its inputs the clock signal CK and the state signal S. The invention is not limited to this, and FIG. 12 shows a modified embodiment in which the switching arrangement 19 for selecting either the first reference voltage source $V_{11}$ or the second reference voltage source $V_{12}$ comprises two switches 19a, 19b arranged in series. The first switch 19a has as its control input the state signal S, and selects either the first reference voltage source $V_{11}$ or the second reference voltage source $V_{12}$. The second switch 19b has as its control input the clock signal CK, and either isolates the first reference voltage input 23 from the output of the first switch 19a or connects the first reference voltage input 23 to the output of the first switch 19a to allow the reference voltage selected by the first switch 19a to be applied to the first reference voltage input 23. Other features of the embodiment of FIG. 12 correspond to the features of FIG. 10(a), and their description will not be repeated.

Figure 13:
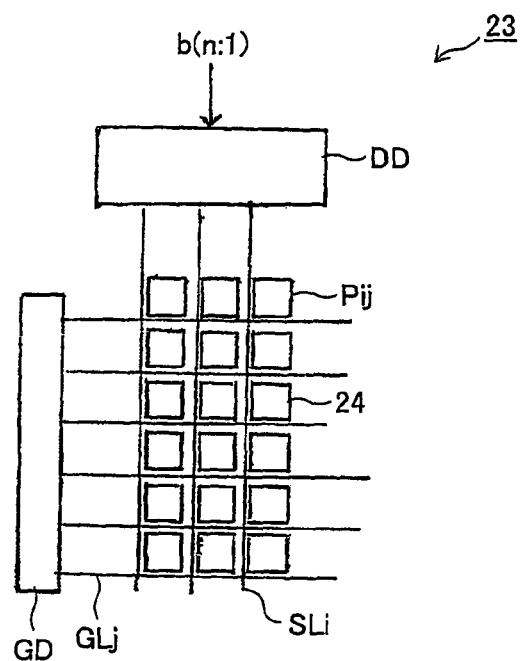
FIG. 13 is a schematic view of a display according to the present invention.

FIG. 13 is a block schematic diagram of a display according to the present invention. The display 23 comprises an image display layer 24, in this embodiment shown as a pixelated image display layer having a plurality of pixels $P_{ij}$. The pixels are arranged in a matrix of rows and columns.

The display further comprises a display driver DD for generating suitable drive voltages for application to the pixels $P_{ij}$ of the image display layer. The voltages generated by the display driver are applied to a plurality of source lines $SL_i$, one source line for each column of pixels.

The display 23 further comprises a plurality of gate lines $GL_j$. Voltages are applied, in use, to the gate lines $GL_j$ by a gate driver circuit GD.

In operation, the input digital code b(n:1) is input to the display, to the display driver DD. The display driver generates suitable output voltages in response to the input word, and applies the output voltages to the source lines $SL_i$, for example applies an output voltage to each source line in sequence. At the same time, the gate driver DD supplies suitable output voltages to the gate lines, to enable each pixel of the image display layer 24 to be driven with a suitable voltage to achieve a desired display for that pixel. The particular voltages required to be output by the display driver DD and the gate driver GD will depend on the nature of the image display layer 24 and on the particular method by which the image display layer is driven.

As an example, the image display layer 24 may be a liquid crystal display layer. If the display layer 24 is an active matrix liquid crystal layer, each pixel would be as shown in FIG. 1, with a pixel electrode, a counter electrode, and a transistor or other switch for controlling the voltage applied to the pixel electrode.

The display driver DD of the display 23 of FIG. 13 contains a digital/analogue converter as described herein above, for example the DAC as shown in FIG. 10(a) or a DAC as shown in FIG. 12.

The selection of an output voltage range may be a "one-off" selection, in which a suitable output voltage range is selected at the outset for a particular purpose, for example to select an output voltage range to match the optimum operating point. The selected output voltage range is not subsequently changed, unless there is a significant change in the system. Alternatively, the selection of an output voltage range may change with time, where a state of a system being driven by the DAC is time-dependent (as, for example, in the described example of the DAC driving a liquid crystal display in which the liquid crystal polarity is time-dependent, so that the state signal representing the polarity is time-dependent).

FIG. 13 shows the display 23 as receiving display data (for example from a host, not shown) as an n-bit input code which is passed to the display driver DD, so that the digital-to-analogue converter in the display driver receives the n-bit input code. However, in some cases it is desirable for the input to the digital-to-analogue converter in the display driver to be a digital code having a greater number of bits than the input code to the display. This may be the case, for example if it is desired to perform gamma correction on the data.

Consider the case where data are input to a display as a 6-bit input code, corresponding to 64 equally spaced grey levels. If the display is has a liquid crystal image display layer then, in order to produce these 64 equally spaced grey levels, it is necessary to supply 64 unequally-spaced voltages to the liquid crystal, owing to the non-linear characteristics of the liquid crystal. To obtain 64 unequally-spaced voltages, one possibility is to convert the 6-bit input display data to an 8-bit digital code, for example using a 6-bit to 8-bit look-up table (LUT), to provide an 8-bit input to the digital-to-analogue converter. Only 64 of the 256 possible codes would be used, and the 64 codes to be used would be selected to give 64 equally spaced grey levels.

In more general terms, display data may be input to the display as an m-bit digital code. The input m-bit digital code may be converted to an n-bit digital code, where n>m, for example using an m-bit to n-bit LUT. The n-bit digital code is then passed to a digital-to-analogue converter having an n-bit input.

Figure 14:
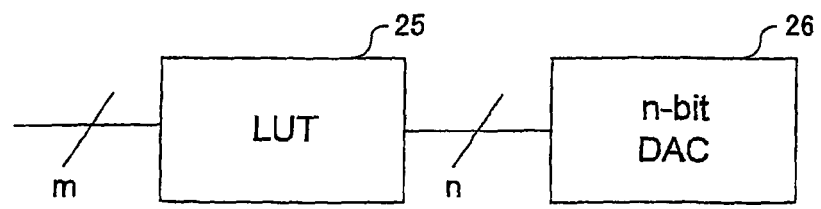
FIG. 14 is a schematic view of another display according to the present invention.

FIG. 14 is a schematic block diagram of a display according to a further embodiment of the invention. In this embodiment the display receives display data as an m-bit digital code from a host (not shown). The input data are passed to an m-bit to n-bit look-up table 25 (where m<n), which converts an input m-bit data code to a respective n-bit data code. The n-bit data code output by the look-up table is then passed to a digital-to-analogue converter 26 which generates an output voltage in dependence on the n-bit data code. The generated voltage is then output (for example to a source line as described in connection with FIG. 13 above). The digital-to-analogue converter 26 may be a digital-to-analogue converter as described in FIG. 10(a) or 12.

In this embodiment, the look-up table 25 and digital-to-analogue converter 26 each form part of the display driver.

The display of FIG. 13, in which the display data are input as an n-bit digital code which is passed to the digital-to-analogue converter may be considered as a special case of FIG. 14, in which case m=n and in which case the look-up table 25 is not required.

The present invention is not limited to the description of the embodiments above, but may be altered by a skilled person within the scope of the claims. An embodiment based on a proper combination of technical means disclosed in different embodiments is encompassed in the technical scope of the present invention.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

The invention claimed is:

1. A display configured to receive display data from a host as an input m-bit digital code, where m is an integer greater than one, the display comprising:
   a display driver configured to convert the input m-bit digital code, the display driver including a digital/analogue converter, the digital/analogue converter including,
   a switched capacitor digital/analogue converter including,
      at least one capacitor, each capacitor having a first plate and a second plate,
      an output, and
      an n-bit digital input, where n is an integer greater than one, the n-bit digital input derived from the m-bit digital code and each bit of the n-bit digital input selecting an input from at least two inputs to input to a corresponding one of the second plates; and
   a switching arrangement configured to, in a zeroing phase of operation, connect one of a plurality of reference voltages to the first plate of the at least one capacitor of the switched capacitor digital/analogue converter, an input to the switching arrangement indicating which one of the plurality of reference voltages to connect to the first plate, the input to the switching arrangement being a signal internal to the display and being independent of the input m-bit digital code.

2. The display as claimed in claim 1 wherein the switching arrangement is adapted to, in a decoding phase, isolate the first plate of each capacitor of the switched capacitor digital/analogue converter from the plurality of reference voltages.

3. The display as claimed in claim 1 wherein the switching arrangement is adapted, in the zeroing phase of operation, to connect the first plate of the at least one capacitor to one of a first reference voltage and a second reference voltage.

4. The display as claimed in claim 1 wherein the switched capacitor digital/analogue converter is a bufferless converter and the output is for direct connection to a capacitive load.

5. The display as claimed in claim 1 and further comprising an image display layer, wherein the driver is for driving at least a selected region of the image display layer.

6. The display as claimed in claim 5 wherein the input to the switching arrangement is dependent on a state of the image display layer.

7. The display as claimed in claim 6 wherein the image display layer is a layer of liquid crystal material and wherein the input to the switching arrangement is dependent on the polarity of the liquid crystal material.

8. The display as claimed in claim 5 wherein the input to the switching arrangement is time-dependent.

9. The display as claimed in claim 5 wherein the image display layer is a layer of liquid crystal material.

10. The display as claimed in claim 1 where m=n.

11. The display as claimed in claim 1 where m<n.

12. The display as claimed in claim 11 wherein the display driver comprises means for deriving the n-bit digital input to the digital/analogue converter from the input m-bit digital code.

13. A display for receiving display data from a host as an input m-bit digital code, where m is an integer greater than one, the display comprising:
   a display driver configured to convert the input m-bit digital code, the display driver including a digital/analogue converter, the digital/analogue converter including,
   a switched capacitor digital/analogue converter including,
      at least one capacitor, each capacitor having a first plate and a second plate,
      an output, and
      an n-bit digital input, where n is an integer greater than one, the n-bit digital input derived from the m-bit digital code and each bit of the n-bit digital input selects an input from at least two inputs to input to a corresponding one of the second plates; and
   a switching arrangement configured to, in a zeroing phase of operation, connect one of a plurality of reference voltages to the first plate of the at least one capacitor of the switched capacitor digital/analogue converter, an input to the switching arrangement indicating which one of the plurality of reference voltages to connect to the first plate, the input to the switching arrangement being a signal internal to the display and being independent of the input m-bit digital code,
   wherein the switched capacitor digital/analogue converter is a bi-directional switched capacitor digital/analogue converter.

14. The display as claimed in claim 13, wherein the switched capacitor digital/analogue converter comprises (n−1) capacitors.

15. The display as claimed in claim 13 wherein the switching arrangement is adapted to, in a decoding phase, isolate the first plate of each capacitor of the switched capacitor digital/analogue converter from the plurality of reference voltages.

16. The display as claimed in claim 13 wherein the switching arrangement is adapted, in the zeroing phase of operation, to connect the first plate of the at least one capacitor to one of a first reference voltage and a second reference voltage.

17. The display as claimed in claim 16 wherein the first and second reference voltages are selected such that the output voltage range from the converter when the first reference voltage is selected in the zeroing phase does not overlap the output voltage range from the converter when the second reference voltage is selected in the zeroing phase.

18. The display as claimed in claim 16 wherein the first and second reference voltages are selected such that the output voltage range from the converter when the first reference voltage is selected in the zeroing phase overlaps the output voltage range from the converter when the second reference voltage is selected in the zeroing phase.

19. The display as claimed in claim 13 where m=n.

20. The display as claimed in claim 13 where m<n.

21. The display as claimed in claim 20 wherein the display driver comprises means for deriving the n-bit digital input to the digital/analogue converter from the input m-bit digital code.

* * * * *